(12) United States Patent
Yamaguchi et al.

(10) Patent No.: US 10,870,919 B2
(45) Date of Patent: Dec. 22, 2020

(54) GAS SUPPLY METHOD AND FILM FORMING METHOD

(71) Applicant: TOKYO ELECTRON LIMITED, Tokyo (JP)

(72) Inventors: Katsumasa Yamaguchi, Nirasaki (JP); Kensaku Narushima, Nirasaki (JP); Hironori Yagi, Nirasaki (JP); Kouichi Sekido, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 160 days.

(21) Appl. No.: 15/901,075

(22) Filed: Feb. 21, 2018

(65) Prior Publication Data
US 2018/0251894 A1    Sep. 6, 2018

(30) Foreign Application Priority Data

Mar. 2, 2017 (JP) ................. 2017-039191

(51) Int. Cl.
  *C23C 16/14* (2006.01)
  *C23C 16/455* (2006.01)
  (Continued)

(52) U.S. Cl.
  CPC ........ *C23C 16/45527* (2013.01); *C23C 16/14* (2013.01); *H01L 21/28562* (2013.01);
  (Continued)

(58) Field of Classification Search
  CPC . C23C 16/14; C23C 16/45527; C23C 16/455; C23C 16/45512
  See application file for complete search history.

(56) References Cited

U.S. PATENT DOCUMENTS

| | | | |
|---|---|---|---|
| 6,282,368 B1 * | 8/2001 | Horie | C23C 16/448 261/133 |
| 2002/0067917 A1 * | 6/2002 | Takamatsu | C23C 16/4404 392/388 |

(Continued)

FOREIGN PATENT DOCUMENTS

| | | | | |
|---|---|---|---|---|
| CN | 101307435 A | 11/2008 | | |
| CN | 101983418 B * | 9/2013 | ............. | H01L 21/31 |

(Continued)

OTHER PUBLICATIONS

"Physics and Technology of Thin Films," Chen Guoping, Southeast University Press. p. 49-50, May 1993.

*Primary Examiner* — Bret P Chen
(74) *Attorney, Agent, or Firm* — Nath, Goldberg & Meyer; Jerald L. Meyer

(57) ABSTRACT

There is provided a gas supply method for temporarily storing a raw material gas generated by vaporizing a raw material accommodated in a raw material container inside a buffer tank together with a carrier gas and subsequently supplying the raw material gas into a processing container. The gas supply method includes: controlling a flow rate of a gas exhausted from the buffer tank and a flow rate of the raw material gas and the carrier gas filled in the buffer tank, so that a second internal pressure of the buffer tank becomes equal to a first internal pressure of the buffer tank when a process is performed by supplying the raw material gas into the processing container, before supplying the raw material gas into the processing container.

5 Claims, 8 Drawing Sheets

(51) Int. Cl.
H01L 21/285 (2006.01)
H01L 21/3205 (2006.01)
H01L 21/28 (2006.01)

(52) U.S. Cl.
CPC .. H01L 21/28568 (2013.01); H01L 21/32051 (2013.01); *H01L 21/28079* (2013.01); *H01L 21/28088* (2013.01); *H01L 21/28097* (2013.01); *H01L 21/28518* (2013.01)

(56) References Cited

U.S. PATENT DOCUMENTS

| | | | | |
|---|---|---|---|---|
| 2006/0010909 | A1* | 1/2006 | Briglia | F25J 3/04084 62/606 |
| 2007/0042119 | A1* | 2/2007 | Matthysse | C23C 16/4481 427/248.1 |
| 2008/0170984 | A1* | 7/2008 | Tenne | C01G 39/06 423/509 |
| 2010/0009079 | A1* | 1/2010 | Yamazaki | C23C 16/405 427/255.28 |
| 2011/0100483 | A1* | 5/2011 | Nagata | B01B 1/005 137/334 |
| 2013/0186332 | A1* | 7/2013 | Hirose | C23C 16/52 118/712 |
| 2015/0152557 | A1 | 6/2015 | Okura et al. | |
| 2015/0322567 | A1* | 11/2015 | Hidaka | C23C 16/4481 392/400 |
| 2016/0071720 | A1* | 3/2016 | Nitta | H01L 21/0228 438/763 |
| 2016/0273101 | A1 | 9/2016 | Komori et al. | |
| 2017/0221731 | A1* | 8/2017 | Tanaka | C03C 17/30 |
| 2018/0251898 | A1* | 9/2018 | Yamaguchi | C23C 16/14 |

FOREIGN PATENT DOCUMENTS

| | | | |
|---|---|---|---|
| CN | 106011777 A | 10/2016 | |
| EP | 0498622 A2 * | 2/1992 | ................ B01J 3/02 |
| EP | 0905276 A2 * | 3/1999 | ............. C23C 16/44 |
| JP | 2016-134569 A | 7/2016 | |
| JP | 2016-145409 A | 8/2016 | |
| JP | 2016-171244 A | 9/2016 | |
| JP | 2016-225396 A | 12/2016 | |
| KR | 1020160115781 A | 10/2016 | |

\* cited by examiner

GAS SUPPLY METHOD AND FILM FORMING METHOD

CROSS-REFERENCE TO RELATED APPLICATION

This application is based upon and claims the benefit of priority from Japanese Patent Application No. 2017-039191, filed on Mar. 2, 2017, the entire contents of which are incorporated herein by reference.

TECHNICAL FIELD

The present disclosure relates to a gas supply device, a gas supply method and a film forming method.

BACKGROUND

When manufacturing an LSI, a tungsten film is widely used for a MOSFET gate electrode, a contact with a source/drain, a word line of a memory and the like.

As a method of forming a tungsten film, a so-called atomic layer deposition (ALD) method has been used in which a tungsten hexachloride ($WCl_6$) gas as a raw material gas and an $H_2$ gas as a reducing gas are alternately supplied a plurality of times to a substrate disposed inside a processing container. According to this method, the $WCl_6$ gas generated by subliming $WCl_6$ accommodated in a film forming raw material tank is temporarily stored in a buffer tank and then supplied into the processing container so that a necessary $WCl_6$ gas can be supplied in a short period of time.

Moreover, in the aforementioned method, if a difference between an internal pressure of the buffer tank and an internal pressure of the film forming raw material tank is large at the start of a process, there is a problem that when the $WCl_6$ gas is supplied into the processing container, a period of time is required until the flow rate of the $WCl_6$ gas is stabilized.

SUMMARY

Some embodiments of the present disclosure provide a gas supply device capable of stabilizing a flow rate of a raw material gas at the start of a process in a short period of time.

According to one embodiment of the present disclosure, there is provided a gas supply device for vaporizing a raw material inside a raw material container and supplying a raw material gas into a processing container together with a carrier gas, including: a buffer tank provided between the raw material container and the processing container; an Evac line configured to exhaust an interior of the buffer tank and an interior of the raw material container; a memory part that stores a first internal pressure of the buffer tank when a process is performed by supplying the raw material gas into the processing container; and a control part configured to control a flow rate of a gas exhausted to the Evac line and a flow rate of the raw material gas and the carrier gas filled in the buffer tank, so that a second internal pressure of the buffer tank becomes equal to the first internal pressure stored in the memory part before supplying the raw material gas into the processing container.

According to another embodiment of the present disclosure, there is provided a gas supply method for temporarily storing a raw material gas generated by vaporizing a raw material accommodated in a raw material container inside a buffer tank together with a carrier gas and subsequently supplying the raw material gas into a processing container, including: controlling a flow rate of a gas exhausted from the buffer tank and a flow rate of the raw material gas and the carrier gas filled in the buffer tank, so that a second internal pressure of the buffer tank becomes equal to a first internal pressure of the buffer tank when a process is performed by supplying the raw material gas into the processing container, before supplying the raw material gas into the processing container.

According to another embodiment of the present disclosure, there is provided a film forming method for forming a metal film by repeating a raw material gas supply step of temporarily storing a raw material gas generated by vaporizing a raw material accommodated in a raw material container inside a buffer tank together with a carrier gas and subsequently supplying the raw material gas into a processing container, and a reducing gas supply step of supplying a reducing gas for reducing the raw material gas into the processing container, including: a first film forming process of forming the metal film on a first substrate by repeating the raw material gas supply step and the reducing gas supply step; a storing process of storing a first internal pressure of the buffer tank in the raw material gas supply step of the first film forming process; a depressurizing process of depressurizing an interior of the buffer tank; an adjusting process of adjusting a second internal pressure of the buffer tank to the first internal pressure stored in the storing process by filling the buffer tank with the raw material gas and the carrier gas after the depressurizing process; and a second film forming process of forming the metal film on a second substrate different from the first substrate by repeating the raw material gas supply step and the reducing gas supply step after the adjusting process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
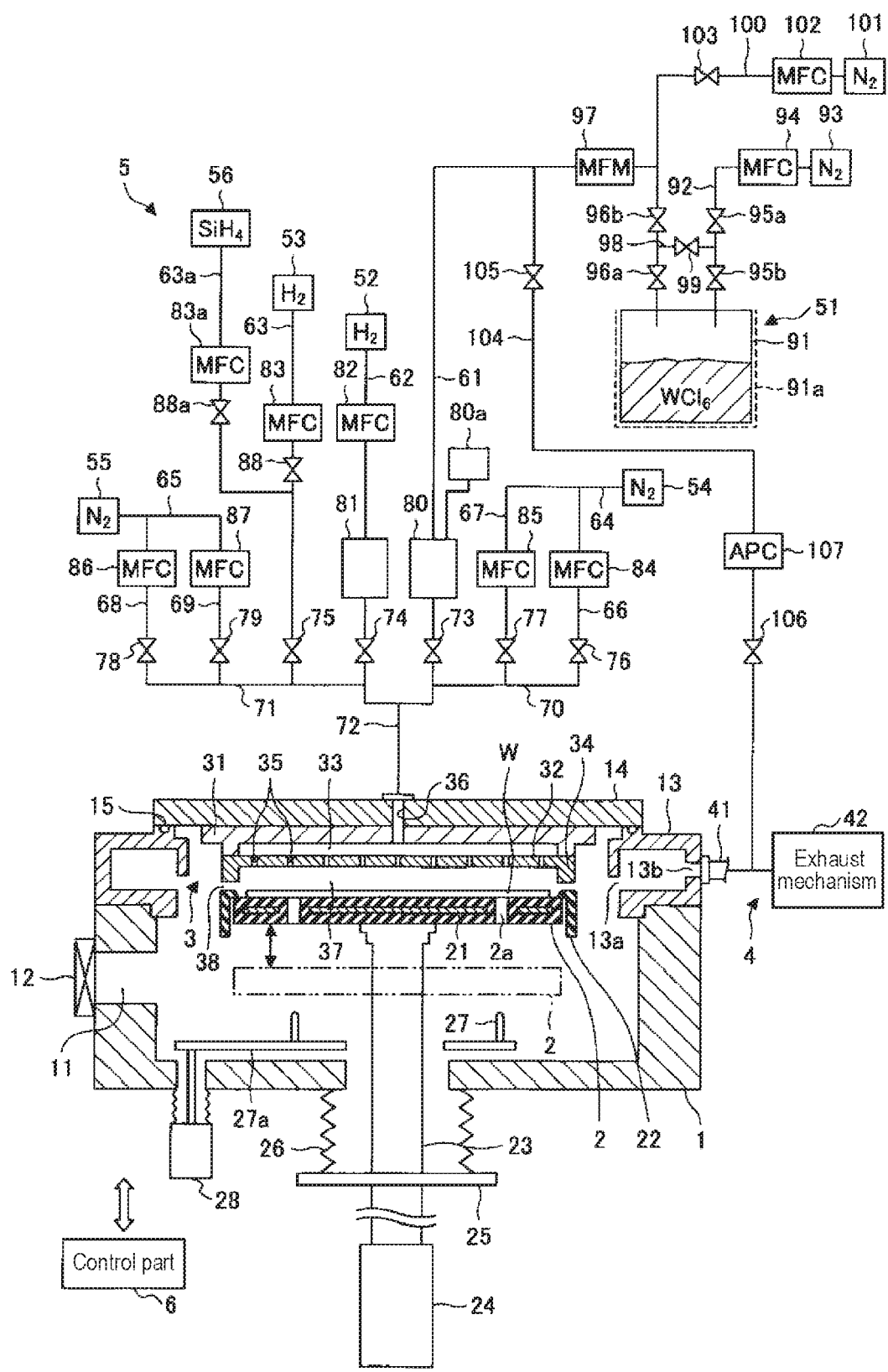
FIG. 1 is a schematic sectional view showing an example of a film forming apparatus provided with a gas supply device according to the present embodiment.

Hereinafter, a mode for carrying out the present disclosure will be described with reference to the drawings. In the specification and the drawings, substantially the same components are denoted by the same reference numerals, and redundant descriptions thereof are omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

FIG. 1 is a schematic cross sectional view illustrating an example of a film forming apparatus provided with a gas supply deice according to an embodiment of the present disclosure. The film forming apparatus according to the present embodiment is configured as an apparatus that can form a film by an atomic layer deposition (ALD) method and a chemical vapor deposition (CVD) method.

The film forming apparatus includes a processing container 1, a susceptor 2 for horizontally supporting a semiconductor wafer (hereinafter, simply referred to as a "wafer" W) as a substrate inside the processing container 1, a shower head 3 for supplying a processing gas into the processing container 1 in the form of a shower, an exhaust part 4 for exhausting the interior of the processing container 1, a processing gas supply mechanism 5 for supplying the processing gas to the shower head 3, and a control part 6.

The processing container 1 is made of metal such as aluminum, and has a substantially cylindrical shape. A loading/unloading port 11 for loading and unloading the wafer W therethrough is formed in a sidewall of the processing container 1. The loading/unloading port 11 is configured to be opened and closed by a gate valve 12. An annular exhaust duct 13 having a rectangular cross section is installed on a main body of the processing container 1. A slit 13a is formed along an inner peripheral surface of the exhaust duct 13. In addition, an exhaust port 13b is formed in an outer wall of the exhaust duct 13. A ceiling wall 14 is installed on an upper surface of the exhaust duct 13 so as to close an upper opening of the processing container 1. A seal ring 15 is hermetically sealed between the ceiling wall 14 and the exhaust duct 13.

The susceptor 2 has a disk shape having a size corresponding to the wafer W, and is supported by a support member 23. The susceptor 2 is made of a ceramic material such as aluminum nitride (AlN) or a metal material such as an aluminum or nickel-based alloy. A heater 21 for heating the wafer W is embedded in the susceptor 2. The heater 21 generates heat based on power supplied from a heater power source (not shown). The wafer W is controlled to have a prescribed temperature by controlling an output of the heater 21 based on a temperature signal of a thermocouple (not shown) installed around a wafer mounting surface defined in the upper surface of the susceptor 2.

A cover member 22 made of ceramic such as alumina is installed in the susceptor 2 so as to cover an outer peripheral region of the wafer mounting surface and a side surface of the susceptor 2.

The support member 23 supporting the susceptor 2 extends from the center of a bottom surface of the susceptor 2 to a lower side of the processing container 1 through a hole portion formed in a bottom wall of the processing container 1. A lower end of the support member 23 is connected to an elevating mechanism 24. The susceptor 2 is configured to be moved up and down by the elevating mechanism 24 between a processing position shown in FIG. 1 and a transfer position where the wafer is transferable as indicated by the dashed double-dotted line below the processing position, while being supported by the support member 23. Furthermore, a flange portion 25 is installed in a lower side of the support member 23 below the processing container 1. A bellows 26 configured to isolate an internal atmosphere of the processing container 1 from ambient air and to be flexible with the vertical movement of the susceptor 2 is installed between the bottom surface of the processing container 1 and the flange portion 25.

Three wafer support pins 27 (here, only two are shown) are installed near the bottom surface of the processing container 1 so as to protrude upward from an elevating plate 27a. The wafer support pins 27 can be lifted and lowered by an elevating mechanism 28 installed below the processing container 1 through the elevating plate 27a. The wafer support pins 27 are inserted into respective through holes 2a installed in the susceptor 2 at the transfer position and can be moved upward and downward on the upper surface of the susceptor 2. By lifting and lowering the wafer support pins 27 in this manner, the wafers W are transferred between the water transfer mechanism (not shown) and the susceptor 2.

The shower head 3 is made of metal and is installed so as to face the susceptor 2. The shower head 3 has substantially the same diameter as that of the susceptor 2. The shower head 3 includes a body section 31 fixed to the ceiling wall 14 of the processing container 1 and a shower plate 32 installed below the body section 31. A gas diffusion space 33 is formed between the body section 31 and the shower plate 32. A gas introduction hole 36 is formed in the gas diffusion space 33 so as to penetrate the body section 31 and the center of the ceiling wall 14 of the processing container 1. An annular projection 34 protruding downward is formed in a peripheral edge portion of the shower plate 32. Gas discharge holes 35 are formed in an inner flat surface of the annular projection 34 of the shower plate 32.

When the susceptor 2 is located at the processing position, a process space 37 is defined between the shower plate 32 and the susceptor 2, and the annular projection 34 and the upper surface of the cover member 22 are brought close to each other to form an annular clearance 38.

The exhaust part 4 includes an exhaust pipe 41 connected to the exhaust port 13b of the exhaust duct 13 and an exhaust mechanism 42 equipped with a vacuum pump, a pressure control valve and the like, and connected to the exhaust pipe 41. During the processing, the gas within the processing container 1 reaches the exhaust duct 13 via the slit 13a, and is exhausted from the exhaust duct 13 via the exhaust pipe 41 by the exhaust mechanism 42 of the exhaust part 4.

The processing gas supply mechanism 5 includes a $WCl_6$ gas supply mechanism 51, a first $H_2$ gas supply source 52, a second $H_2$ gas supply source 53, a first $N_2$ gas supply source 54, a second $N_2$ gas supply source 55, and an $SiH_4$ gas supply source 56. The $WCl_6$ gas supply mechanism 51 supplies a $WCl_6$ gas as a metal chloride gas which is a raw material gas. The first $H_2$ gas supply source 52 supplies an $H_2$ gas as a reducing gas. The second $H_2$ gas supply source 53 supplies an $H_2$ gas as an additive reducing gas. The first $N_2$ gas supply source 54 and the second $N_2$ gas supply source 55 supply an N₂ gas as a purge gas. The SiH₄ gas supply source 56 supplies an SiH₄ gas.

In addition, the processing gas supply mechanism 5 includes a WCl₆ gas supply line 61, a first H₂ gas supply line 62, a second H₂ gas supply line 63, a first N₂ gas supply line 64, a second N₂ gas supply line 65, and an SiH₄ gas supply line 63a. The WCl₆ gas supply line 61 is a line extending from the WCl₆ gas supply mechanism 51. The first H₂ gas supply line 62 is a line extending from the first H₂ gas supply source 52. The second H₂ gas supply line 63 is a line extending from the second H₂ gas supply source 53. The first N₂ gas supply line 64 is a line which extends from the first N₂ gas supply source 54 and supplies the N₂ gas to the side of the WCl₆ gas supply line 61. The second N₂ gas supply line 65 is a line which extends from the second N₂ gas supply source 55 and supplies the N₂ gas to the side of the first H₂ gas supply line 62. The SiH₄ gas supply line 63a is a line which extends from the gas supply source 56 and is installed to be connected to the second H₂ gas supply line 63

The first N₂ gas supply line 64 is branched into a first continuous N₂ gas supply line 66 through which the N₂ gas is supplied at all times during film formation by the ALD method, and a first flash purge line 67 through which the N₂ gas is supplied only during a purging step. Furthermore, the second N gas supply line 65 is branched into a second continuous N₂ gas supply line 68 through which the N₂ gas is supplied at all times during the film formation by the ALD method, and a second flash purge line 69 through which the N₂ gas is supplied only during the purging step. In addition, the first continuous N₂ gas supply line 66 and the first flash purge line 67 are connected to a first connection line 70. The first connection line 70 is connected to the WCl₆ gas supply line 61. The second H₂ gas supply line 63, the second continuous N₂ gas supply line 68, and the second flash purge line 69 are connected to a second connection line 71. The second connection line 71 is connected to the first H₂ gas supply line 62. The WCl₆ gas supply line 61 and the first H₂ gas supply line 62 are joined in a join pipe 72. The join pipe 72 is connected to the aforementioned gas introduction hole 36.

Opening/closing valves 73, 74, 75, 76, 77, 78, and 79 for switching a gas during ALD are installed at the most downstream sides of the WCl₆ gas supply line 61, the first H₂ gas supply line 62, the second H₂ gas supply line 63, the first continuous N₂ gas supply line 66, the first flash purge line 67, the second continuous N₂ gas supply line 68, and the second flash purge line 69, respectively. In addition, mass flow controllers 82, 83, 84, 85, 86, and 87 as flow rate controllers are installed at the upstream sides of the respective opening/closing valves of the first H₂ gas supply line 62, the second H₂ gas supply line 63, the first continuous N₂ gas supply line 66, the first flash purge line 67, the second continuous N₂ gas supply line 68, and the second flash purge line 69, respectively. The mass flow controller 83 is installed at an upstream side of the second H₂ gas supply line 63 toward a joint where the SiH₄ gas supply line 63a is connected to the second H₂ gas supply line 63. An opening/closing valve 88 is installed between the mass flow controller 83 and the joint. Furthermore, a mass flow controller 83a and an opening/closing valve 88a are installed in the SiH₄ gas supply line 63a sequentially from the upstream side. Thus, either or both of the H₂ gas and the SiH₄ gas can be supplied via the second H₂ gas supply line 63. Buffer tanks 80 and 81 are respectively installed in the WCl₆ gas supply line 61 and the first H₂ gas supply line 62 so that an appropriate gas can be supplied in a short period of time. A manometer 80a configured to detect an internal pressure of the buffer tank 80 is installed in the buffer tank 80.

The WCl₆ gas supply mechanism 51 includes a film-forming raw material tank 91 as a raw material vessel for storing WCl₆. WCl₆ is a solid raw material that is solid at room temperature. A heater 91a is installed around the film-forming raw material tank 91 so that a film-forming raw material within the film-forming raw material tank 91 is heated to a proper temperature to sublimate WCl₆. The aforementioned WCl₆ gas supply line 61 is inserted into the film-forming raw material tank 91 from above.

In addition, the WCl₆ gas supply mechanism 51 includes a carrier gas pipe 92 inserted into the film-forming raw material tank 91 from above, a carrier N₂ gas supply source 93 for supplying the N₂ gas as a carrier gas to the carrier gas pipe 92, a mass flow controller 94 as a flow rate controller connected to the carrier gas pipe 92, opening/closing valves 95a and 95b installed at the downstream side of the mass flow controller 94, and opening/closing valves 96a and 96b and a flowmeter 97 installed near the film-forming raw material tank 91 in the WCl₆ gas supply line 61. In the carrier gas pipe 92, the opening/closing valve 95a is installed at a position directly below the mass flow controller 94, and the opening/closing valve 95b is installed at an insertion end side of the carrier gas pipe 92. Furthermore, the opening/closing valves 96a and 96b and the flowmeter 97 are arranged in the named order from the insertion end of the WCl₆ gas supply line 61.

A bypass pipe 98 is installed so as to connect a position between the opening/closing valve 95a and the opening/closing valve 95b of the carrier gas pipe 92 and a position between the opening/closing valve 96a and the opening/closing valve 96b of the WCl₆ gas supply line 61. An opening/closing valve 99 is installed in the bypass pipe 98. By closing the opening/closing valves 95b and 96a and opening the opening/closing valves 99, 95a and 96b, the N₂ gas supplied from the carrier N₂ gas supply source 93 is supplied to the WCl₆ gas supply line 61 through the carrier gas pipe 92 and the bypass pipe 98. Thus, the WCl₆ gas supply line 61 can be purged.

Furthermore, an end portion at the downstream side of a dilution N₂ gas supply line 100 for supplying the N₂ gas as a dilution gas joins the upstream side of the flowmeter 97 in the WCl₆ gas supply line 61. A dilution N₂ gas supply source 101 serving as a supply source of the N₂ gas is installed at an end portion at the upstream side of the dilution N₂ gas supply line 100. A mass flow controller 102 and an opening/closing valve 103 are installed in the dilution N₂ gas supply line 100 from the corresponding upstream side.

One end of an EVAC line 104 is connected to a downstream position of the flowmeter 97 in the WCl₆ gas supply line 61, and the other end of the EVAC line 104 is connected to the exhaust pipe 41. An opening/closing valve 105 and an opening/closing valve 106 are installed at a position near the WCl₆ gas supply line 61 in the EVAC line 104 and at a position near the exhaust pipe 41, respectively. A pressure control valve 107 is also installed between the opening/closing valve 105 and the opening/closing valve 106. Then, the interior of the film-forming raw material tank 91 and the interior of the buffer tank 80 can be exhausted by the exhaust mechanism 42 by opening the opening/closing valves 105, 106, 96a and 96b while closing the opening/closing valves 99, 95a, and 96b.

The control part 6 includes a process controller equipped with a microprocessor (computer) that controls the respective components, specifically the valves, the power supplies, the heater, the pump and the like, a user interface, and a storage part. Each component of the film forming apparatus is electrically connected to the process controller so as to be controlled. The user interface is connected to the process controller, and includes a keyboard that causes an operator to execute input operations of commands in order to manage each component of the film forming apparatus, a display that visually displays an operation status of each component of the film forming apparatus, and the like. The storage part is also connected to the process controller. The storage part stores a control program for realizing various processes to be executed by the film forming apparatus under the control of the process controller, a control program that causes each component of the film forming apparatus to execute a predetermined process according to the processing conditions, namely a process recipe, various databases, or the like. The internal pressure of the buffer tank 80 when the $WCl_6$ gas is supplied into the processing container 1 to perform a process in the past is stored in the storage part for each process recipe. The process recipe is stored in a storage medium (not shown) in the storage part. The storage medium may be one that is fixedly installed such as a hard disk, or one that is portable such as a CDROM, a DVD, or a semiconductor memory. Also, the recipe may be appropriately transmitted from another device, for example, via a dedicated line. If necessary, a predetermined process recipe may be called from the storage part according to an instruction provided from the user interface and then executed by the process controller so that a desired process is performed in the film forming apparatus under the control of the process controller.

[Gas Supply Method]

A gas supply method according to the present embodiment will be described by taking, as an example, a case (film forming method) in which a tungsten film is formed using the above-described film forming apparatus. The gas supply method according to the present embodiment is applied to, for example, a case where a tungsten film is formed on a wafer W in which a base film is formed on a surface of a silicon film having a recess such as a trench or hole.

Figure 2:
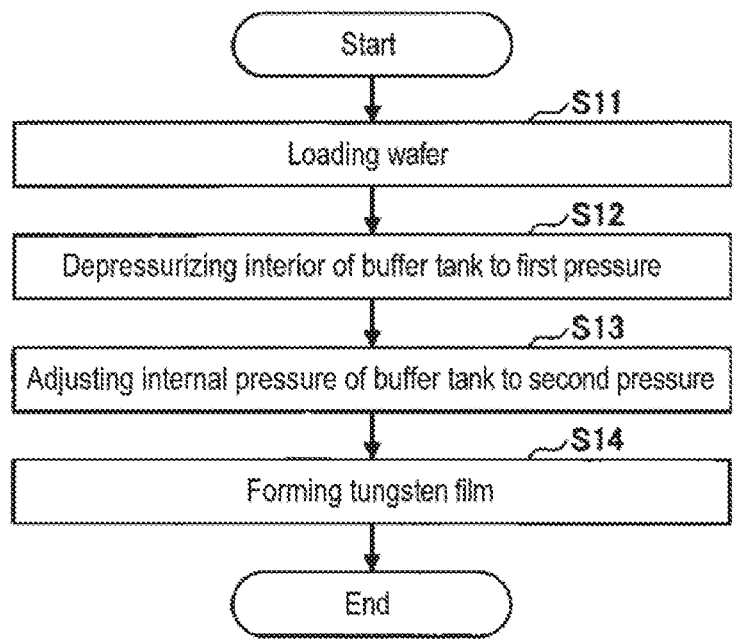
FIG. 2 is a flowchart showing a film forming method according to the present embodiment.

FIG. 2 is a flowchart showing the film forming method according to the present embodiment.

First, the wafer W is loaded into the processing container 1 (step S11: loading step). Specifically, the gate valve 12 is opened in a state in which the susceptor 2 is lowered to the transfer position. The wafer W is loaded into the processing container 1 via the loading/unloading port 11 by a transfer device (not shown) and is mounted on the susceptor 2 heated to a predetermined temperature by the heater 21. Subsequently, the susceptor 2 is raised up to the processing position, and the interior of the processing container 1 is depressurized to a predetermined degree of vacuum. Thereafter, the opening/closing valves 76 and 78 are opened, and the opening/closing valves 73, 74, 75, 77 and 79 are closed. As a result, the $N_2$ gas is supplied from the first $N_2$ gas supply source 54 and the second $N_2$ gas supply source 55 into the processing container 1 through the first continuous $N_2$ gas supply line 66 and the second continuous $N_2$ gas supply line 68, thereby increasing the pressure. The temperature of the water W mounted on the susceptor 2 is stabilized. At this time, the $WCl_6$ gas is supplied from the film forming raw material tank 91 into the buffer tank 80, and the internal pressure of the buffer tank 80 is maintained to be substantially constant. As the wafer W, it may be possible to use a wafer in which a base film is formed on a surface of a silicon film having a recess such as a trench or hole. Examples of the base film include titanium-based material films such as a TiN film, a TiSiN film, a Ti silicide film, a Ti film, a TiO film, a TiAlN film and the like. Furthermore, examples of the base film may include tungsten-based compound films such as a WN film, a $WSi_x$ film, a WSiN film and the like. By forming the base film on the surface of the silicon film, it is possible to form the tungsten film with good adhesion. In addition, it is possible to shorten an incubation time.

Next, the interior of the buffer tank 80 is depressurized to a first pressure (step S12: depressurizing step). Specifically, by opening the opening/closing valves 105, 106, 96a and 96b in a state in which the opening/closing valves 99, 95a, 95b and 103 are closed, the interior of the buffer tank 80 and the interior of the film forming raw material tank 91 are exhausted via the Evac line 104 by the exhaust mechanism 42. At this time, the interior of the buffer tank 80, the interior of the film forming raw material tank 91 and the $WCl_6$ gas supply line 61 are depressurized to the first pressure. The first pressure may be a pressure maintained by the exhaust mechanism 42 or a predetermined pressure adjusted by a pressure control valve 107.

Subsequently, the internal pressure of the buffer tank 80 is adjusted to a second pressure higher than the first pressure (step S13: adjusting step). Specifically, the opening/closing valves 105 and 106 are closed, and the opening/closing valves 95a, 95b and 103 are opened. As a result, the buffer tank 80 is filled with the $N_2$ gas supplied from the carrier $N_2$ gas supply source 93, the $WCl_6$ gas supplied from the film forming raw material tank 91 and the $N_2$ gas supplied from the dilution $N_2$ gas supply line 100, Furthermore, by adjusting the opening degree of the pressure control valve 107, the internal pressure of the buffer tank 80 may be adjusted to the second pressure. The second pressure may be equal to the internal pressure of the buffer tank 80 available when a process is performed beforehand by supplying the $WCl_6$ gas into the processing container 1. The internal pressure may be stored in the memory part in advance, for example. The previously performed process may be, for example, a process performed recently by the same process recipe.

Subsequently, a tungsten film is formed using the $WCl_6$ gas which is a metal chloride gas and the $H_2$ gas which is a reducing gas (step S14: film forming step). The film forming step is performed after the internal pressure of the buffer tank 80 is adjusted to the second pressure in the adjusting step.

Figure 3:
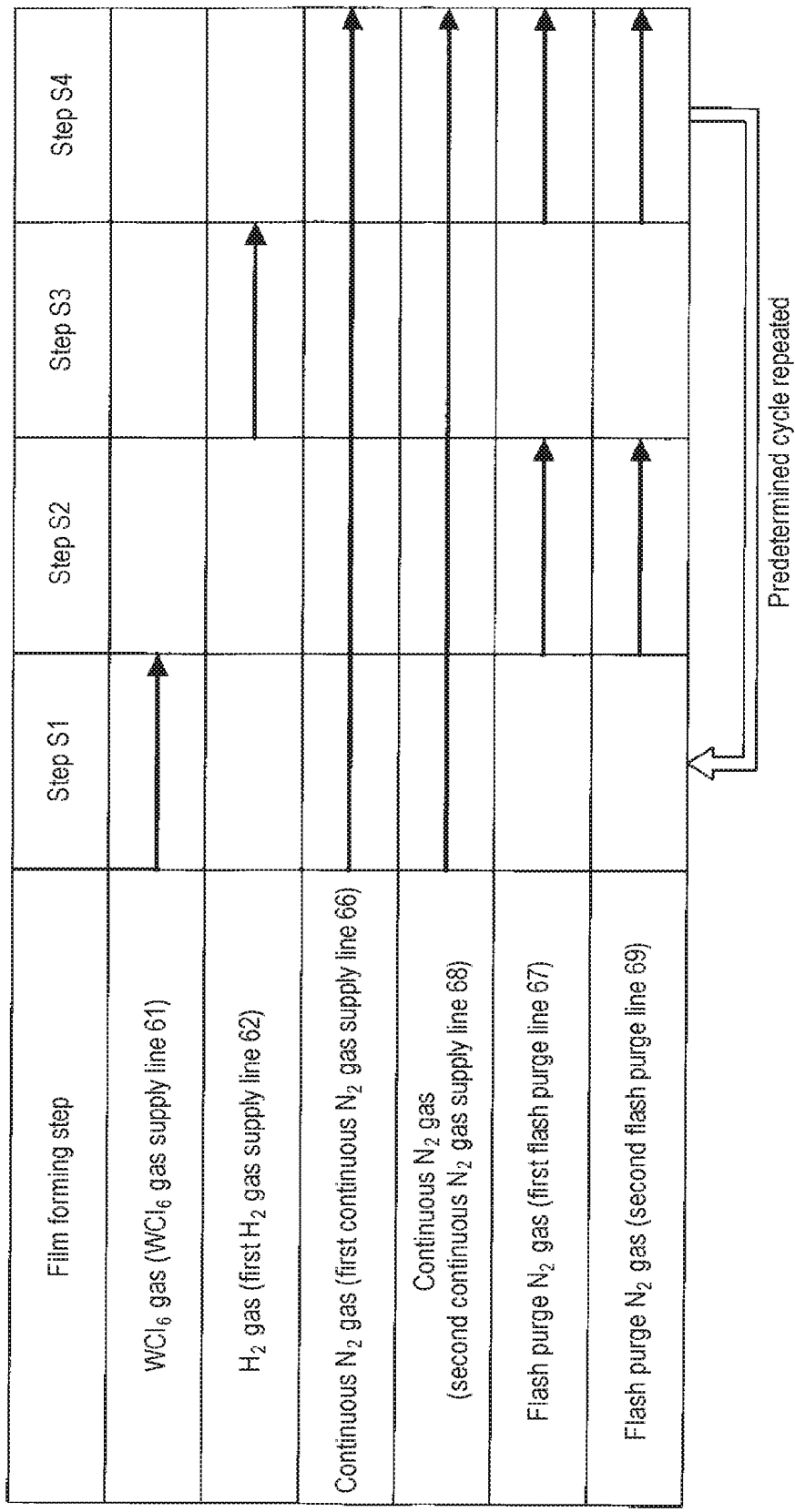
FIG. 3 is a view showing a gas supply sequence in a film forming step of the film forming method according to the present embodiment.

FIG. 3 is a view showing a gas supply sequence in the film forming step of the film forming method according to the present embodiment.

Step S1 is a raw material gas supply step of supplying a $WCl_6$ gas to the process space 37. In step S1, first, an $N_2$ gas is continuously supplied from the first $N_2$ gas supply source 54 and the second $N_2$ gas supply source 55 via the first continuous $N_2$ gas supply line 66 and the second continuous $N_2$ gas supply line 68 while opening the opening/closing valves 76 and 78. Furthermore, by opening the opening/closing valve 73, the $WCl_6$ gas is supplied from the $WCl_6$ gas supply mechanism 51 to the process space 37 in the processing container 1 via the $WCl_6$ gas supply line 61. At this time, the $WCl_6$ gas is temporarily stored in the buffer tank 80 and then supplied into the processing container 1. Also, in step S1, an $H_2$ gas may be supplied as an additive reducing gas into the processing container 1 via the second $H_2$ gas supply line 63 extending from the second $H_2$ gas supply source 53. By supplying the reducing gas together with the $WCl_6$ gas in step S1, the supplied $WCl_6$ gas is activated so that the film forming reaction in a subsequent step S3 is likely to occur. Therefore, it is possible to maintain high step coverage, and to increase a deposition rate by increasing a deposition film thickness per cycle. A flow rate of the additive reducing gas may be set at a flow rate to such an extent that the CVD reaction does not occur in step S1.

Step S2 is a purging step of purging an excess $WCl_6$ gas or the like in the process space 37, In step S2, the opening/closing valve 73 is closed to stop the supply of the $WCl_6$ gas while continuing to supply the $N_2$ gas via the first continuous $N_2$ gas supply line 66 and the second continuous $N_2$ gas supply line 68. Furthermore, the opening/closing valves 77 and 79 are opened, and the $N_2$ gas (flash purge $N_2$ gas) is also supplied from the first flash purge line 67 and the second flash purge line 69 so that the excess $WCl_6$ gas or the like in the process space 37 is purged by a large flow rate of the $N_2$ gas.

Step S3 is a reducing gas supply step of supplying an $H_2$ gas to the process space 37. In step S3, the opening/closing valves 77 and 79 are closed to stop the supply of the $N_2$ gas from the first flash purge line 67 and the second flash purge line 69. Furthermore, the opening/closing valve 74 is opened while continuing to supply the $N_2$, gas via the first continuous $N_2$ gas supply line 66 and the second continuous $N_2$ gas supply line 68. Thus, the $H_2$ gas is supplied as a reducing gas from the first $H_2$ gas supply source 52 to the process space 37 via the first $H_2$ gas supply line 62. At this time, the $H_2$ gas is temporarily stored in the buffer tank 81 and then supplied into the processing container 1. $WCl_6$ adsorbed onto the wafer W is reduced by step S3. A flow rate of the $H_2$ gas at this time may be set at a flow rate sufficient for the reduction reaction to occur.

Step S4 is a purging step of purging an excess $H_2$ gas in the process space 37. In step S4, the opening/closing valve 74 is closed to stop the supply of the $H_2$ gas from the first $H_2$ gas supply line 62 while continuing to supply the N gas via the first continuous $N_2$ gas supply line 66 and the second continuous $N_2$ gas supply line 68. Furthermore, the opening/closing valves 77 and 79 are opened and the $N_2$ gas (flash purge $N_2$ gas) is also supplied from the first flash purge line 67 and the second flash purge line 69 so that, similar to step S2, the excess $H_2$ gas in the process space 37 is purged by a large flow rate of the $N_2$ gas.

The above steps S1 to S4 are carried out one cycle in a short period of time to form a thin tungsten unit film. The cycle of these steps is repeated a plurality of times to form a thin tungsten film of a desired film thickness. The film thickness of the tungsten film at this time may be controlled by the number of repetitions of the cycle. In the present embodiment, the case where the loading step, the depressurizing step, the adjusting step and the film forming step are performed in the named order has been described as an example. However, the loading step and the depressurizing step may be performed at the same time.

In the present embodiment, prior to the formation of the tungsten film, the internal pressure of the buffer tank 80 is adjusted to the second pressure which is equal to the internal pressure of the buffer tank 80 when a process is performed beforehand by supplying the $WCl_6$ gas into the processing container 1. The reason for this is as follows.

Figure 4:
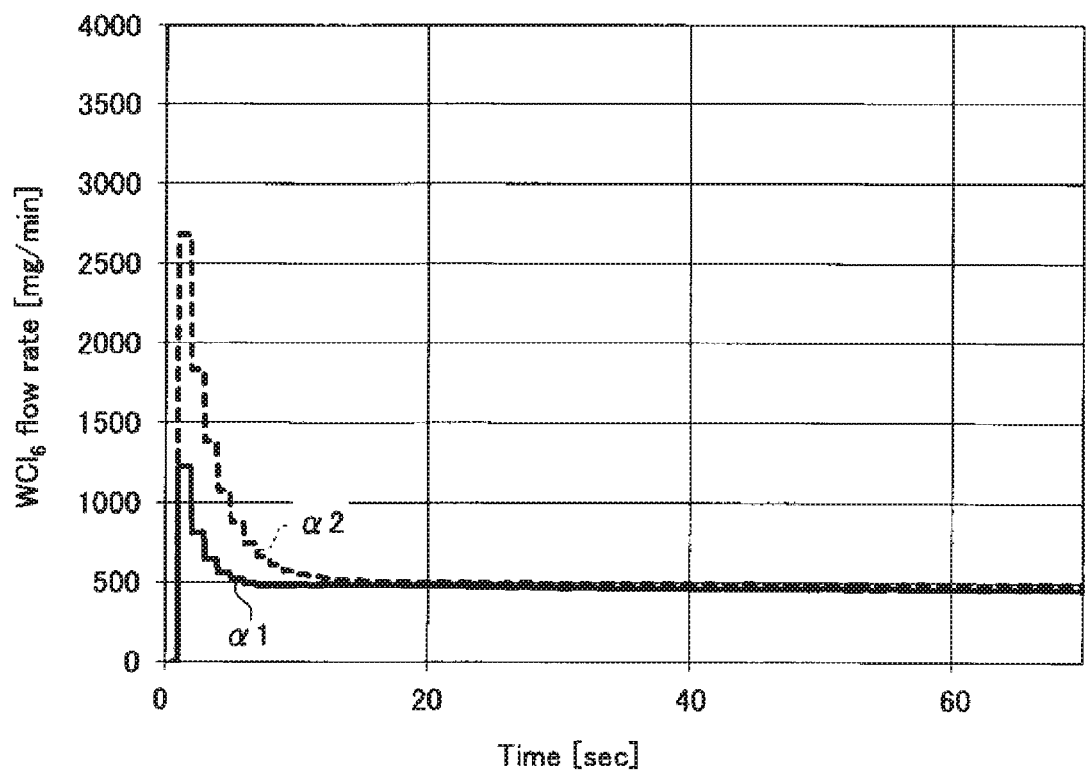
FIG. 4 is a view showing the relationship between an elapsed time after the start of a film forming step and a flow rate of a $WCl_6$ gas.

FIG. 4 is a view showing the relationship between an elapsed time after the start of the film forming step and the flow rate of the $WCl_6$ gas. In FIG. 4, the horizontal axis represents the elapsed time (sec) after the start of the film forming step, and the vertical axis represents the flow rate (mg/min) of the $WCl_6$ gas. In FIG. 4, the solid line (characteristic line α1) indicates the flow rate of the $WCl_6$ gas when the difference between the internal pressure of the buffer tank 80 and the internal pressure of the film forming raw material tank 91 is small (for example, 1,333 Pa). The broken line (characteristic line α2) indicates the flow rate of the $WCl_6$ gas when the difference between the internal pressure of the buffer tank 80 and the internal pressure of the film forming raw material tank 91 is large (for example, 2,666 Pa).

When the $WCl_6$ gas is temporarily stored in the buffer tank 80 and then supplied into the processing container 1, if the difference between the internal pressure of the buffer tank 80 and the internal pressure of the film forming raw material tank 91 is large at the start of the process (film forming step), the flow rate of the $WCl_6$ gas fluctuates greatly after the start of the film forming step. Therefore, it takes a period of time to stabilize the flow rate of the $WCl_6$ gas in the film forming step.

Under the circumstances, a method of stabilizing the flow rate of the $WCl_6$ gas in a short period of time by suppressing the fluctuation in the flow rate of the $WCl_6$ gas after the start of such a film forming step was studied. As a result, it was found that it is effective to, before the $WCl_6$ gas is supplied into the processing container 1, adjust the internal pressure of the buffer tank 80 so as to become equal to the internal pressure of the buffer tank 80 when a process is performed beforehand by supplying the $WCl_6$ gas into the processing container 1. More specifically, the flow rate of the gas exhausted to the Evac line 101 and the flow rate of the $WCl_6$ gas and the $N_2$ gas as a carrier gas to be filled in the buffer tank 80 are controlled so that the internal pressure of the buffer tank 80 becomes equal to the internal pressure of the buffer tank 80 when a process is performed beforehand by supplying the $WCl_6$ gas into the processing container 1. As a result, the $N_2$ gas containing the $WCl_6$ gas can be supplied into the processing container 1 in a state in which there is no or little difference between the internal pressure of the buffer tank 80 and the internal pressure of the film forming raw material tank 91. Thus, as indicated by a solid line in FIG. 4, it is possible to suppress the fluctuation in the flow rate of the $WCl_6$ gas after the start of the film forming step. As a result, in the film forming step, it is possible to stabilize the flow rate of the $WCl_6$ gas in a short period of time. In the illustrated example, the period of time required until the flow rate of the $WCl_6$ gas is stabilized is about 5 seconds.

On the other hand, when the difference between the internal pressure of the buffer tank 80 and the internal pressure of the film forming raw material tank 91 is large at the start of the process (film forming step), as indicated by a broken line in FIG. 4, the flow rate of the $WCl_6$ gas fluctuates greatly after the start of the film forming step. Therefore, in the film forming step, it takes a period of time to stabilize the flow rate of the $WCl_6$ gas. In the illustrated example, the period of time required until the flow rate of the $WCl_6$ gas is stabilized is about 10 seconds.

Figure 5:
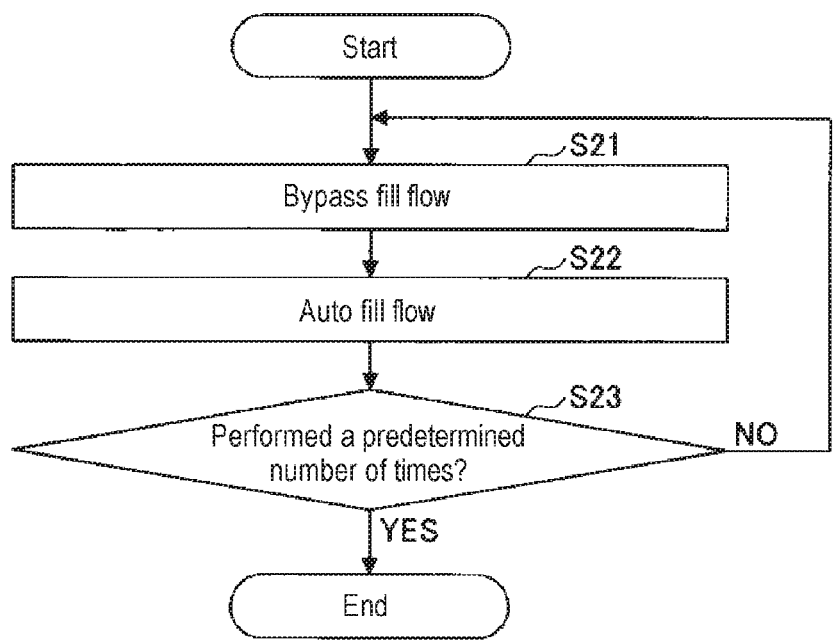
FIG. 5 is a flowchart showing a flow rate adjusting step in the film forming method according to the present embodiment.

Subsequently, a flow rate adjusting step which is configured to be performed prior to the loading step (step S11) in the film forming method according to the present embodiment will be described. FIG. 5 is a flowchart showing the flow rate adjusting step of the film forming method according to the present embodiment.

First, an $N_2$ gas as a carrier gas and an $N_2$ gas as a dilution gas are supplied into the processing container 1 without supplying the $WCl_6$ gas (step S21: bypass flow step). The bypass flow step is performed in a state in which the wafer W is not disposed in the processing container 1. Specifically, when supplying the $N_2$ gas as a carrier gas and the $N_2$ gas as a dilution gas, the opening/closing valves 95b, 96a, 105 and 106 are closed and the opening/closing valves 95a, 99, 96b and 103 are opened. Then, by opening the opening/closing valve 73, the $N_2$ gas not containing the $WCl_6$ gas is supplied into the processing container 1.

During the bypass flow step, the control part 6 calculates the flow rate of the $WCl_6$ gas based on the detection value of the flowmeter 97 and adjusts the zero point of the flowmeter 97 so that the calculated flow rate of the $WCl_6$ gas becomes zero (performs conversion of the zero point).

Figure 6:
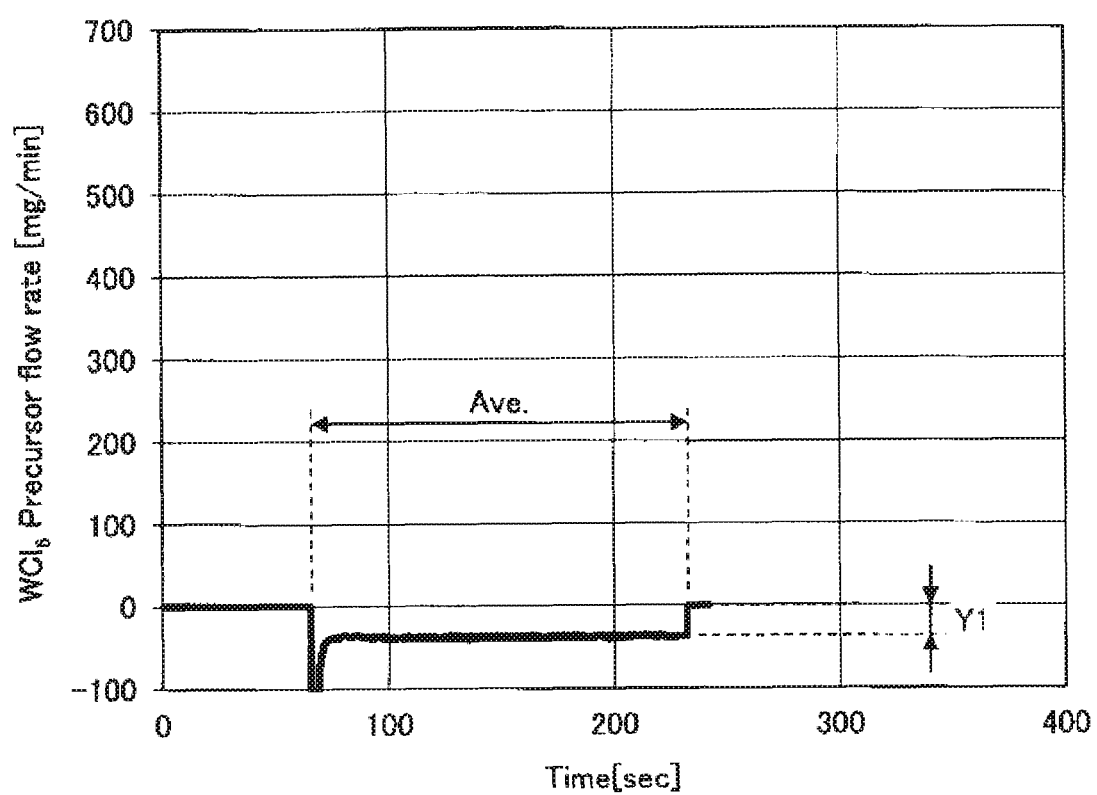
FIG. 6 is a view showing the relationship between an elapsed time in a bypass flow step and a flow rate of a $WCl_6$ gas.

FIG. 6 is a view showing the relationship between an elapsed time in the bypass flow step and a flow rate of the $WCl_6$ gas. In FIG. 6, the horizontal axis represents the elapsed time (sec) in the bypass flow step, and the vertical axis represents the flow rate (mg/min) of the $WCl_6$ gas. As shown in FIG. 6, according to the present embodiment, in the bypass flow step, the average value of the flow rate of the $WCl_6$ gas indicates a value different from 0. Therefore, the control part 6 adjusts the zero point of the flowmeter 97 so that the average value of the flow rate of the $WCl_6$ gas becomes zero. In the illustrated example, the shift amount of the flow rate of the $WCl_6$ gas is Y1.

Subsequently, the $WCl_6$ gas as a raw material gas, the $N_2$ gas as a carrier gas and the $N_2$ gas as a dilution gas are supplied into the processing container 1 (step S22: auto fill flow step). Similar to the bypass flow step, the auto fill flow step is performed in a state in which the wafer W is not disposed in the processing container 1. Specifically, when supplying the $WCl_6$ gas as a raw material gas, the $N_2$ gas as a carrier gas and the $N_2$ gas as a dilution gas, the opening/closing valve 99 is closed and the opening/closing valves 95a, 95b, 96a, 96b and 103 are opened. Then, by opening the opening/closing valve 73, the $N_2$ gas containing the $WCl_6$ gas is supplied into the processing container 1.

During the auto fill flow step, the control part 6 calculates the flow rate of the $WCl_6$ gas based on the detection value of the flowmeter 97 and adjusts the ratio of the flow rate of the $N_2$ gas as a dilution gas to the flow rate of the $N_2$ gas as a carrier gas so that the calculated flow rate of the $WCl_6$ gas becomes a target flow rate. At this time, the total flow rate of the flow rate of the $N_2$ gas as a carrier gas and the flow rate of the $N_2$ gas as a dilution gas is held constant.

Figure 7:
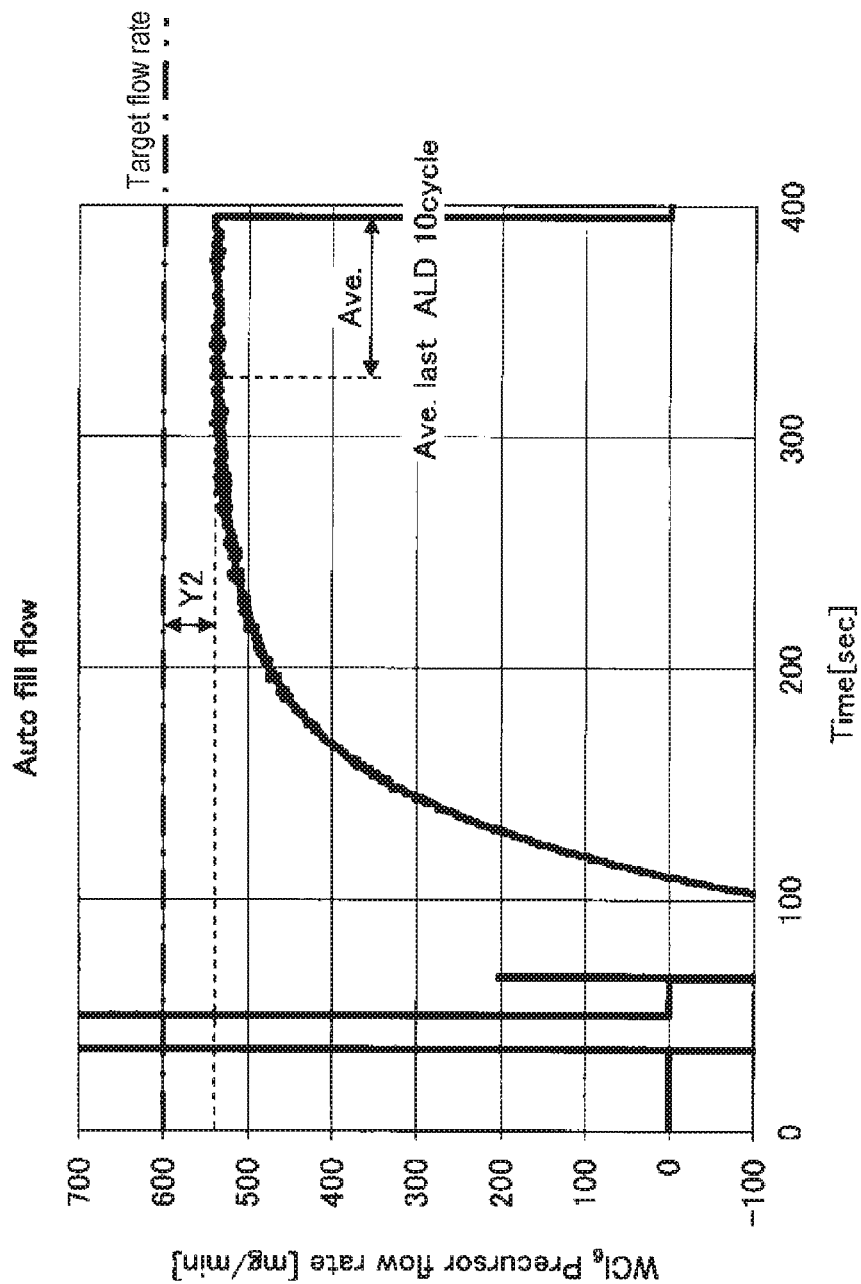
FIG. 7 is a view showing the relationship between an elapsed time in an auto fill flow step and a flow rate of a $WCl_6$ gas.

FIG. 7 is a view showing the relationship between an elapsed time in the auto fill flow step and a flow rate of the $WCl_6$ gas. In FIG. 7, the horizontal axis represents the elapsed time (sec) in the auto fill flow step, and the vertical axis represents the flow rate (mg/min) of the $WCl_6$ gas. As shown in FIG. 7, according to the present embodiment, the average value of the flow rate of the $WCl_6$ gas in a plurality of cycles (for example, 10 cycles) including the last cycle is smaller than the target flow rate. Thus, the control part 6 reduces the ratio of the flow rate of the $N_2$ gas as a dilution gas to the flow rate of the $N_2$ gas as a carrier gas so that the average value of the flow rate of the $WCl_6$ gas in a plurality of cycles (for example, 10 cycles) including the last cycle becomes the target flow rate. In the illustrated example, a difference between the average value of the flow rate of the $WCl_6$ gas in a plurality of cycles (for example, 10 cycles) including the last cycle and the target flow rate is Y2.

Subsequently, when the bypass flow step and the auto fill flow step are performed a predetermined number of times, the process is terminated. On the other hand, if the bypass flow step and the auto fill flow step have not been performed a predetermined number of times, the process returns to step S21 to perform the bypass flow step and the auto fill flow step again. The predetermined number of times is determined in advance by, for example, an administrator or the like.

Figure 8:
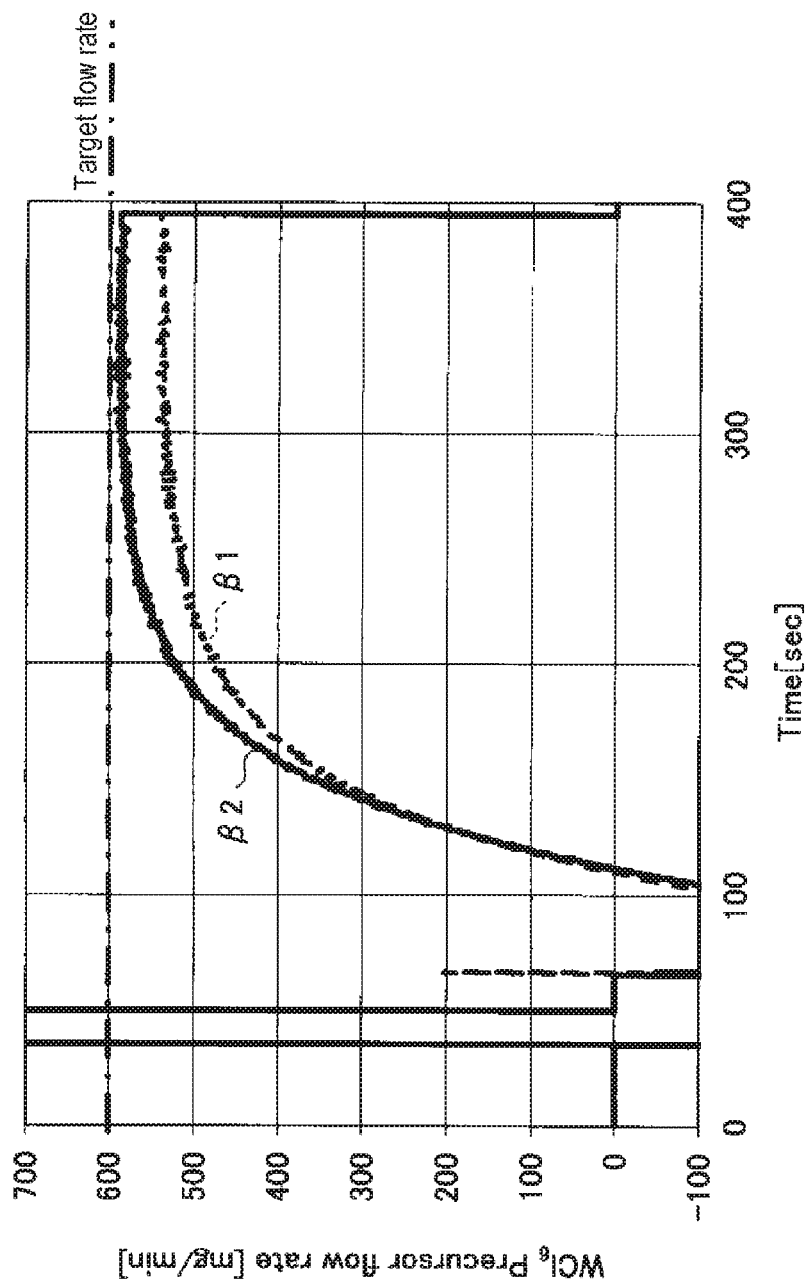
FIG. 8 is a view for explaining the action and effect of a flow rate adjusting step.

FIG. 8 is a view for explaining the action and effect of the flow rate adjusting step. In FIG. 8, the horizontal axis represents an elapsed time (sec) in the auto fill flow step, and the vertical axis represents the flow rate (mg/min) of the $WCl_6$ gas. Further, in FIG. 8, the broken line (characteristic line β1) indicates the flow rate of the $WCl_6$ gas in a first auto fill flow step, and the solid line (characteristic line β2) indicates the flow rate of the $WCl_6$ gas in a second auto fill flow step.

As shown in FIG. 8, by performing the bypass flow step and the auto fill flow step, it is possible to control the flow rate of the $WCl_6$ gas to the target flow rate with high accuracy.

Next, a feedback control configured to be performed when tungsten films are successively formed on a plurality of respective wafers W using the above-described film forming method according to the present embodiment will be described.

First, a tungsten film is formed on a first wafer W, which is a first substrate, by using the above-described film forming method according to the present embodiment (first film forming step).

Subsequently, the control part 6 adjusts the ratio of the flow rate of the $N_2$ gas as a dilution gas to the flow rate of the $N_2$ gas as a carrier gas so that the average value of the flow rate of the $WCl_6$ gas in a plurality of cycles including the last cycle becomes a target flow rate. At this time, the total flow rate of the flow rate of the $N_2$ gas as a carrier gas and the flow rate of the $N_2$ gas as a dilution gas is kept constant. The plurality of cycles may be, for example, 10 cycles.

Subsequently, a tungsten film is formed on a second wafer W, which is a second substrate, by using the above-described film forming method according to the present embodiment (second film forming step).

Subsequently, the control part 6 adjusts the ratio of the flow rate of the $N_2$ gas as a dilution gas to the flow rate of the $N_2$ gas as a carrier gas so that the average value of the flow rate of the $WCl_6$ gas in a plurality of cycles including the last cycle becomes a target flow rate. At this time, the total flow rate of the flow rate of the $N_2$ gas as a carrier gas and the flow rate of the $N_2$ gas as a dilution gas is kept constant. The plurality of cycles may be, for example, 10 cycles.

Thereafter, similarly, each time when a tungsten film is formed on a respective wafer W, the feedback control is performed by the control part 6.

Figure 9:
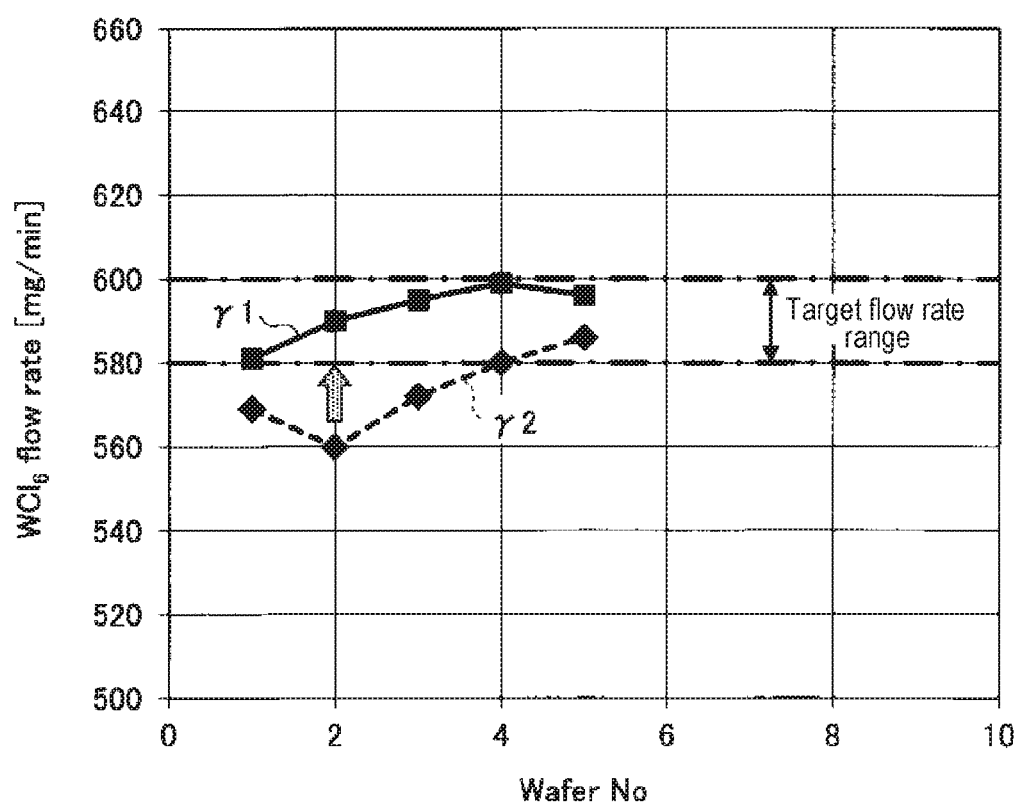
FIG. 9 is a view showing a change in a flow rate of a WCl₆ gas during a continuous process.

FIG. 9 is a graph showing a change in the flow rate of the $WCl_6$ gas during a continuous process, and shows a change in the flow rate of the $WCl_6$ gas when tungsten films are successively formed on a plurality of respective wafers W using the above-described film forming method according to the present embodiment. In FIG. 9, the horizontal axis represents a wafer number and the vertical axis represents the flow rate (mg/min) of the $WCl_6$ gas. Furthermore, in FIG. 9, the solid line (characteristic line γ1) indicates the change in the flow rate of the $WCl_6$ gas when the feedback control is performed, and the broken line (characteristic line γ2) indicates the change in the flow rate of the $WCl_6$ gas when the feedback control is not performed.

As shown in FIG. 9, when the feedback control is performed, the flow rate of the $WCl_6$ gas falls within a target flow rate range in all the wafers W from the first wafer to the fifth wafer. On the other hand, when the feedback control is not performed, the flow rate of the $WCl_6$ gas does not fall within the target flow rate range in the first to third wafers W. By performing the feedback control in this manner, it is possible to control the flow rate of the $WCl_6$ gas to the target flow rate with high accuracy.

While the mode for carrying out the present disclosure has been described above, the above contents are not intended to limit the scope of the present disclosure. Various modifications and improvements may be made within the scope of the present disclosure.

In the above-described embodiment, the case where the tungsten film is formed using the $WCl_6$ gas as a metal chloride gas has been described as an example. The present disclosure is applicable as long as a metal film is formed by alternately supplying a metal chloride gas and a reducing gas. As the metal chloride gas, other tungsten chloride gases such as a $WCl_5$ gas and the like may be used. Even when the $WCl_5$ gas is used, the $WCl_5$ gas shows substantially the same behavior as the $WCl_6$ gas. When the $WCl_5$ gas is used, $WCl_5$ which is solid at room temperature may be used as a film forming raw material. The present disclosure is applicable to, for example, a case where a molybdenum film is formed using a molybdenum chloride gas and a reducing gas, or a case where a tantalum film is formed using a tantalum chloride gas and a reducing gas. In these cases, molybdenum chloride or tantalum chloride which is solid at room temperature may be used as a film forming raw material. In the above-described embodiment, a solid raw material is sublimed to obtain a raw material gas. Alternatively, a liquid raw material may be vaporized to obtain a raw material gas.

Moreover, in the aforementioned embodiment, there has been described a case where the $H_2$ gas is used as the reducing gas as an example. However, any reducing gas may be used so long as it contains hydrogen, and an $SiH_4$ gas, a $B_2H_6$ gas, an $NH_3$ gas, or the like, in addition to the $H_2$ gas, may be used. Two or more of the $H_2$ gas, the $SiH_4$ gas, the $B_2H_6$ gas, and the $NH_3$ gas may be supplied. Also, reducing gases other than these gases, for example, a $PH_3$ gas or an $SiH_2Cl_2$ gas, may be used. From the viewpoint of obtaining a low resistance value by further reducing an impurity in a film, the $H_2$ gas may be used. Also, other inert gases such as an Ar gas may be used as a purge gas and a carrier gas instead of the $N_2$ gas.

In addition to the aforementioned embodiment, there has been described a case where the semiconductor wafer is used as the substrate as an example, but the semiconductor wafer may be a silicon wafer, or may be a compound semiconductor wafer of GaAs, SiC, GaN, and the like. Furthermore, the substrate is not limited to the semiconductor wafer and the present disclosure may be applied to a glass substrate used for a flat panel display (FPD) such as a liquid crystal display device, a ceramic substrate, and the like.

According to the present disclosure in some embodiments, it is possible to stabilize a flow rate of a raw material gas at the start of a process in a short period of time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a metal film by repeating a raw material gas supply step of temporarily storing a raw material gas generated by vaporizing a raw material accommodated in a raw material container inside a buffer tank together with a carrier gas and subsequently supplying the raw material gas into a processing container, and a reducing gas supply step of supplying a reducing gas for reducing the raw material gas into the processing container, comprising:
    a first film forming process of forming the metal film on a first substrate by repeating the raw material gas supply step and the reducing gas supply step;
    a storing process of storing a first internal pressure of the buffer tank in the raw material gas supply step of the first film forming process;
    a depressurizing process of depressurizing an interior of the buffer tank;
    an adjusting process of adjusting a second internal pressure of the buffer tank to the first internal pressure stored in the storing process by filling the buffer tank with the raw material gas and the carrier gas and exhausting a gas from the buffer tank after the depressurizing process; and
    a second film forming process of forming the metal film on a second substrate different from the first substrate by repeating the raw material gas supply step and the reducing gas supply step after the adjusting process.

2. The method of claim 1, further comprising a process of performing an ALD cycle in which a cycle of supplying the raw material gas and a reducing gas for reducing the raw material gas into the processing container in the named order is repeated a plurality of times,
    wherein the first internal pressure of the buffer tank is based on a pressure at the time of supplying the raw material gas in a plurality of cycles including at least the last cycle of the ALD cycle.

3. The method of claim 1, further comprising a process of supplying a dilution gas into the buffer tank,
    wherein the total flow rate of a flow rate of the carrier gas and a flow rate of the dilution gas is kept constant.

4. The method of claim 1, wherein the second internal pressure of the buffer tank is controlled by adjusting a pressure control valve.

5. The method of claim 1, wherein e raw material is a solid raw material of tungsten chloride.

* * * * *